(12) United States Patent
Rich et al.

(10) Patent No.: US 7,371,601 B2
(45) Date of Patent: May 13, 2008

(54) PIEZORESISTIVE SENSING STRUCTURE

(75) Inventors: David B. Rich, Kokomo, IN (US); Steven M. Crist, Lafayette, IN (US)

(73) Assignee: Delphi Technologies, Inc., Troy, MI (US)

( * ) Notice: Subject to any disclaimer, the term of this patent is extended or adjusted under 35 U.S.C. 154(b) by 89 days.

(21) Appl. No.: 11/127,457

(22) Filed: May 12, 2005

(65) Prior Publication Data

US 2006/0258038 A1 Nov. 16, 2006

(51) Int. Cl.
*H01L 21/00* (2006.01)
*G01P 15/00* (2006.01)

(52) U.S. Cl. .................. 438/52; 73/514.36

(58) Field of Classification Search ............ 74/514.33, 74/514.34, 514.36; 438/50, 52
See application file for complete search history.

(56) References Cited

U.S. PATENT DOCUMENTS

| | | | |
|---|---|---|---|
| 5,199,298 A * | 4/1993 | Ng et al. | 73/54.01 |
| 5,344,523 A * | 9/1994 | Fung et al. | 438/53 |
| 5,352,635 A * | 10/1994 | Tu et al. | 438/53 |
| 5,395,802 A * | 3/1995 | Kiyota et al. | 438/52 |
| 5,427,975 A * | 6/1995 | Sparks et al. | 438/52 |
| 5,493,470 A * | 2/1996 | Zavracky et al. | 438/53 |
| 5,511,428 A * | 4/1996 | Goldberg et al. | 73/777 |
| 5,747,705 A * | 5/1998 | Herb et al. | 73/862.59 |
| 5,772,322 A * | 6/1998 | Burns et al. | 374/118 |
| 5,798,283 A * | 8/1998 | Montague et al. | 438/24 |
| 5,808,210 A * | 9/1998 | Herb et al. | 73/862.59 |
| 6,012,336 A * | 1/2000 | Eaton et al. | 73/754 |
| 6,316,796 B1 * | 11/2001 | Petersen et al. | 257/254 |
| 6,511,915 B2 * | 1/2003 | Mlcak | 438/695 |
| 6,757,092 B2 * | 6/2004 | Abu-Ageel | 359/290 |
| 6,888,662 B2 * | 5/2005 | Abu-Ageel | 359/290 |
| 6,953,977 B2 * | 10/2005 | Mlcak et al. | 257/414 |
| 2003/0107794 A1 * | 6/2003 | Siekkinen et al. | 359/291 |
| 2004/0036942 A1 * | 2/2004 | Abu-Ageel | 359/237 |
| 2005/0172717 A1 * | 8/2005 | Wu et al. | 73/514.34 |
| 2006/0037398 A1 * | 2/2006 | Rich | 73/514.34 |
| 2006/0101912 A1 * | 5/2006 | Wu et al. | 73/514.34 |

* cited by examiner

*Primary Examiner*—M. Wilczewski
(74) *Attorney, Agent, or Firm*—Jimmy L. Funke

(57) ABSTRACT

A technique for manufacturing a piezoresistive sensing structure includes a number of process steps. Initially, a piezoresistive element is implanted into a first side of an assembly that includes a semiconductor material. A passivation layer is then formed on the first side of the assembly over the element. The passivation layer is then removed from selected areas on the first side of the assembly. A first mask is then provided on the passivation layer in a desired pattern. A beam, which includes the element, is then formed in the assembly over at least a portion of the assembly that is to provide a cavity. The passivation layer provides a second mask, in the formation of the beam, that determines a width of the formed beam.

15 Claims, 7 Drawing Sheets

PIEZORESISTIVE SENSING STRUCTURE

TECHNICAL FIELD

The present invention is generally directed to a sensing structure and, more specifically, to a piezoresistive sensing structure.

BACKGROUND OF THE INVENTION

Traditionally, piezoresistive sensing structures, such as micro-electro-mechanical (MEM) based piezoresistive accelerometers, have been manufactured with a bond/etch-back process. In this process, a cavity is formed in a handling wafer, which is then bonded to an epitaxial wafer using, for example, a direct silicon bond. Next, desired circuitry is formed in/on the epitaxial wafer. A desired structure is then formed in the epitaxial wafer over the cavity.

With reference to FIG. 1, a relevant portion of an exemplary prior art piezoresistive accelerometer (sensor) 10, formed with the traditional bond/etch-back process, is depicted. As is shown in FIG. 1, a flexible beam 14 couples an inertial mass 16 to a frame 12. It should be appreciated that, while not shown in FIG. 1, multiple beams couple the mass 16 to the frame 12. In general, the frame 12, the mass 16 and the beams 14 are formed from the same plate of material, e.g., an epitaxial silicon wafer. Near the top of and integral to the beam 14 is an implanted piezoresistive layer 18, whose individual piezoresistive elements are connected to appropriate conductors formed in a conductive layer 20. The conductors are arranged to form, in conjunction with the piezoresistive elements, a useful circuit.

With reference to FIGS. 2A-2G, components of a prior art sensor 160 are depicted, during various stages of manufacture. With reference to FIG. 2A, the initial steps in the manufacturing process produce a silicon-on insulator (SOI) wafer with a sealed buried cavity 103. As is shown, the SOI wafer includes a handling wafer 102, which is bonded to an epitaxial wafer 104 with an oxide layer 106. As is depicted in FIG. 2B, a piezoresistive layer 108, e.g., a P-type layer, is implanted into the epitaxial wafer 104, e.g., an N-type epitaxial wafer, through windows in an insulator layer 110. It should be appreciated that the implant type and the epitaxial wafer type may be reversed, if desired, providing the implanted piezoresistive elements are junction-isolated in a lightly doped epitaxial layer.

Next, as shown in FIG. 2C, windows are opened in the insulator layer 110 and a metal layer 112 is formed on the insulator layer 110. The metal layer 112 extends through windows in the insulator layer 110 to contact the piezoresistive elements, formed in the piezoresistive layer 108. The insulator layer 110 may be, for example, a field passivation that includes a layer of thermal oxide and a layer of silicon nitride. It should be appreciated that other passivation layers may also be utilized. Next, selected areas of the insulator layer 110 are etched open. Then, as shown in FIG. 2E, a photoresist layer 114 is applied and patterned.

Next, as is shown in FIG. 2F, a deep reactive ion etch (DRIE) is utilized to free a central mass and define beams of the sensor. As is shown in FIGS. 2F and 2G, a beam 150 has a width that is dictated by the minimum resistive implant width 'A', a space 'B' (required for isolation between the implant 108 and an edge of the passivation layer 110) and a space 'C' (required between the edge of the passivation 110 and the trench cut by the DRIE). Using the prior art approach, the minimum width of the beam is equal to the width 'A' plus two times the space 'B' plus two times the space 'C'. It should be appreciated that this minimum beam width limits the minimum size of the sensor 160 and, as such, prevents further size reduction of the sensor and limits the sensitivity of the sensor. In general, smaller sensors are more economical to produce as they require less silicon area. Further, smaller sensors are frequently more sensitive.

What is needed is a technique that allows the beam width of a sensor to be further reduced, such that the sensor can be made smaller and more sensitive and, in turn, more economical.

SUMMARY OF THE INVENTION

According to one embodiment of the present invention, a technique for manufacturing a piezoresistive sensing structure includes a number of steps. Initially, a piezoresistive element is implanted into a first side of an assembly, which includes a semiconductor material. Next, a passivation layer is formed on the first side of the assembly over the element. The passivation layer is then removed from selected areas on the first side of the assembly. A first mask is then provided on the passivation layer in a desired pattern. A beam, which includes the element, is then formed in the assembly over at least a portion of the assembly that is to provide a cavity. The passivation layer provides a second mask, in the formation of the beam, that determines a width of the formed beam.

According to another aspect of the present invention, the assembly includes a first wafer having the cavity formed into a first side of the first wafer and a second wafer having a first side and a second side opposite the first side. The second side of the second wafer is bonded to the first side of the first wafer. The second wafer may be, for example, an N-type epitaxial wafer and the element may be a P-type piezoresistive element. According to another embodiment, the width of the beam substantially corresponds to a width of the passivation layer that is formed on an area of the first side of the second wafer that is to become the beam. According to one aspect of the present invention, the width of the beam is about 15 microns. The passivation layer may include a thermal oxide layer and a silicon nitride layer. The beam may be formed with a deep reactive ion etch (DRIE).

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
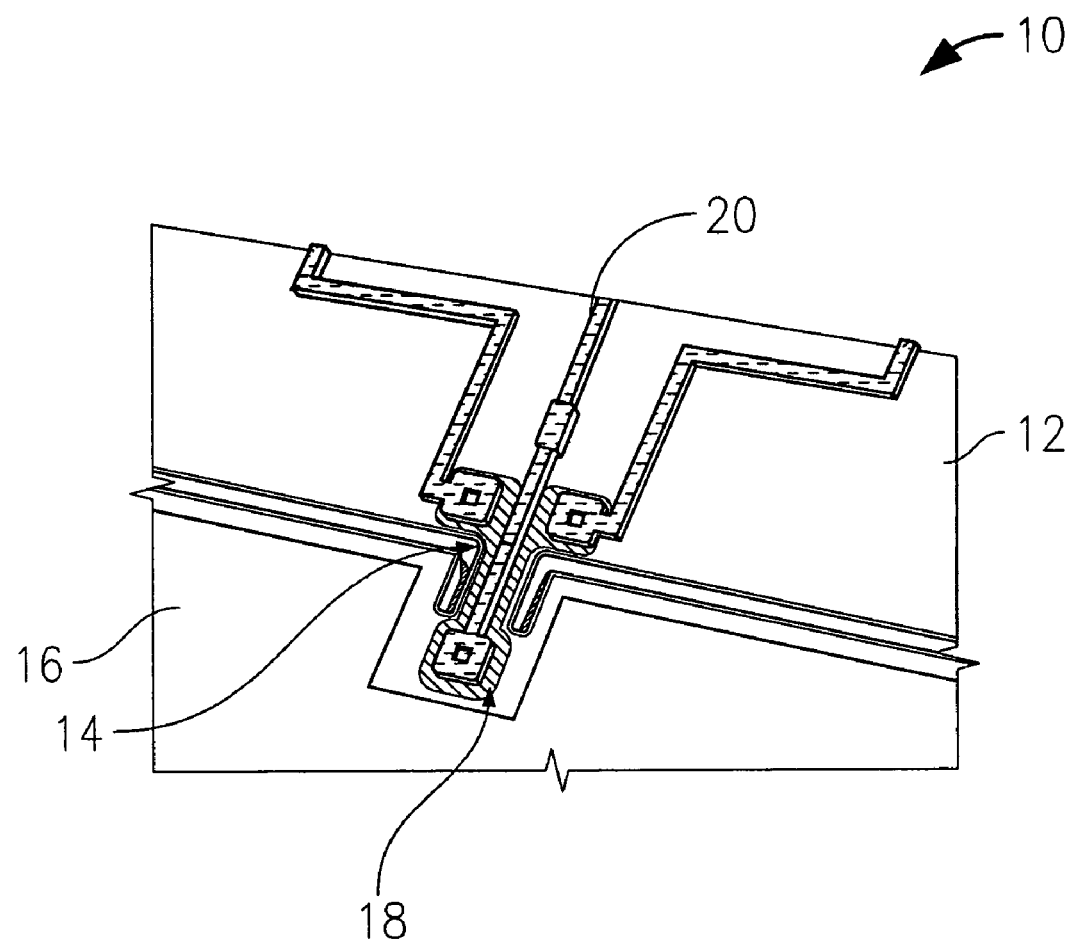
FIG. 1 is a top view of a relevant portion of a prior art piezoresistive accelerometer.
Figure 2A:
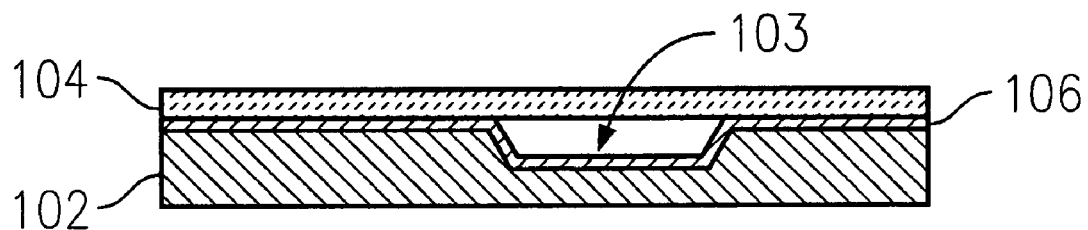
FIGS. 2A-2G depict cross-sectional views of relevant portions of a sensor constructed according to the prior art, during relevant stages of manufacture.
Figure 2B:
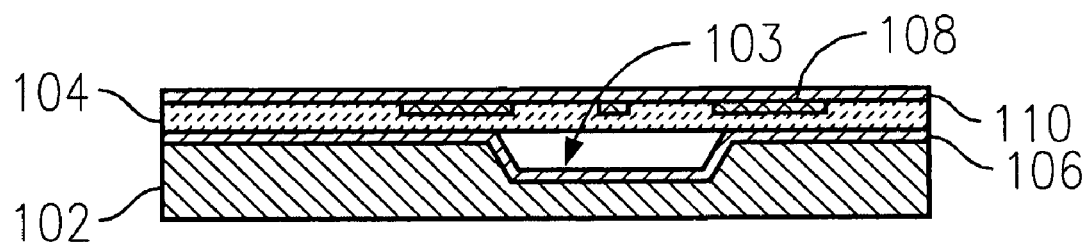
Figure 2C:
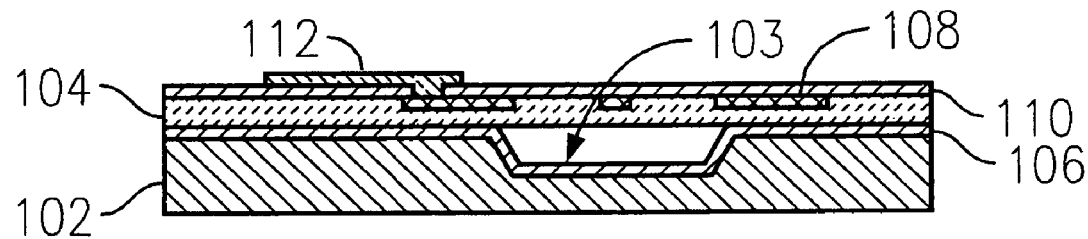
Figure 2D:
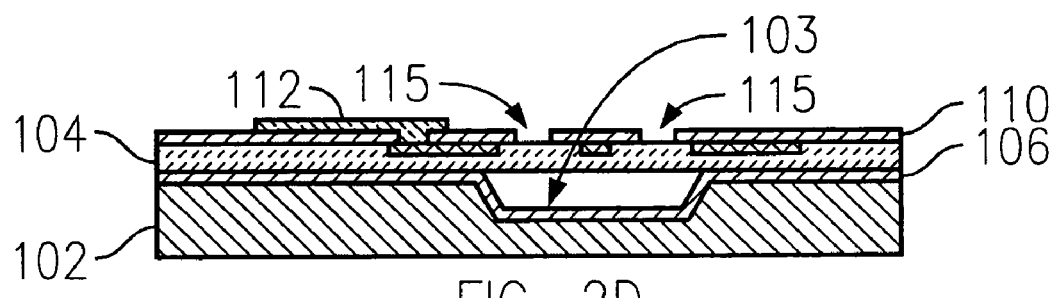
Figure 2E:
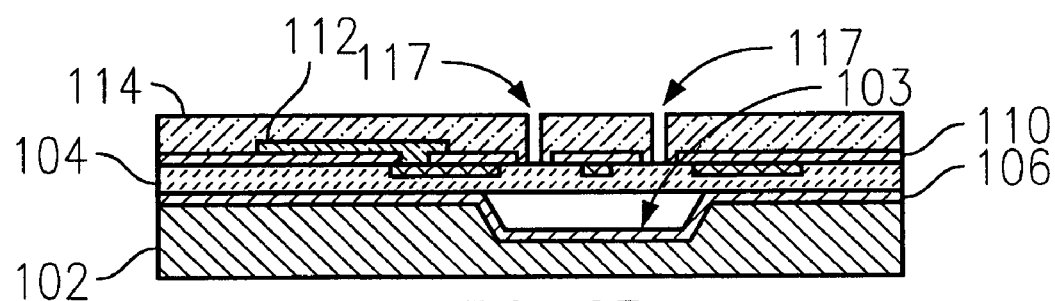
Figure 2F:
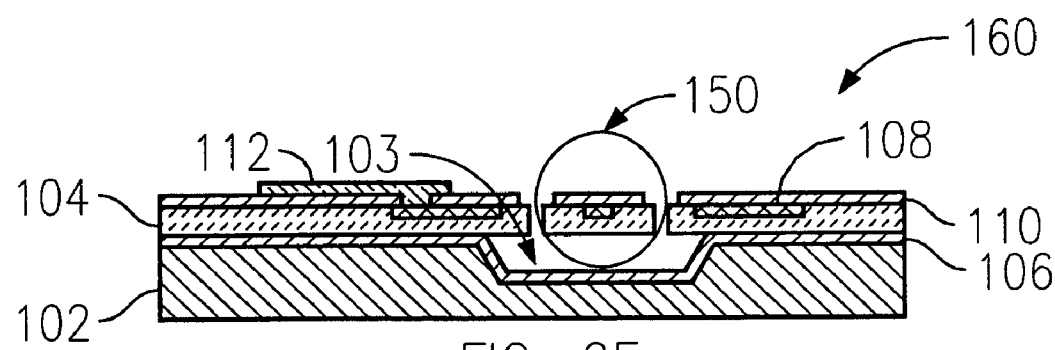
Figure 3A:
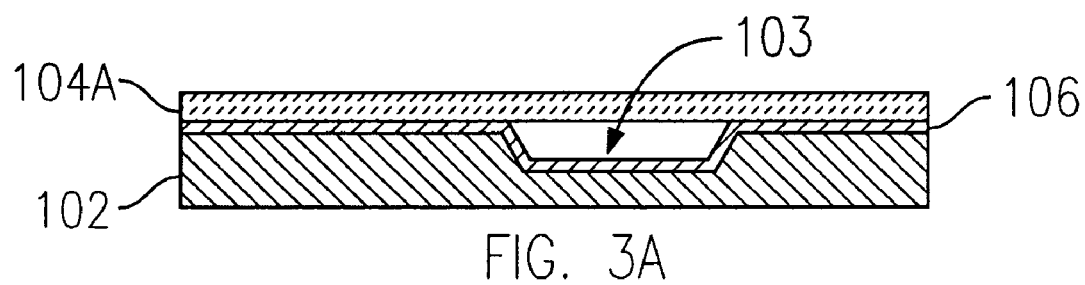
Figure 3B:
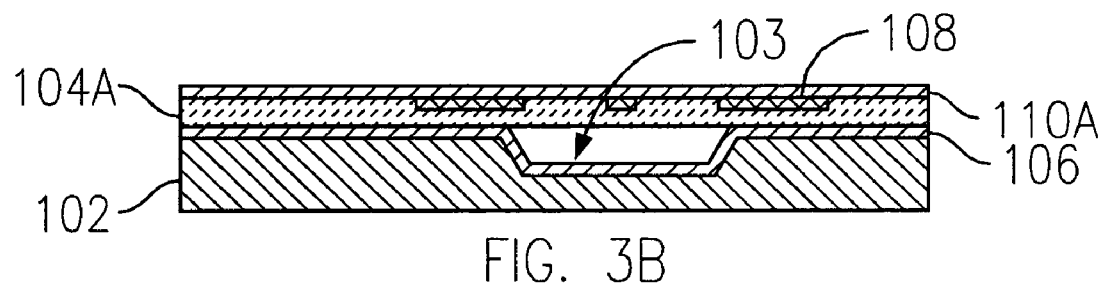
Figure 3C:
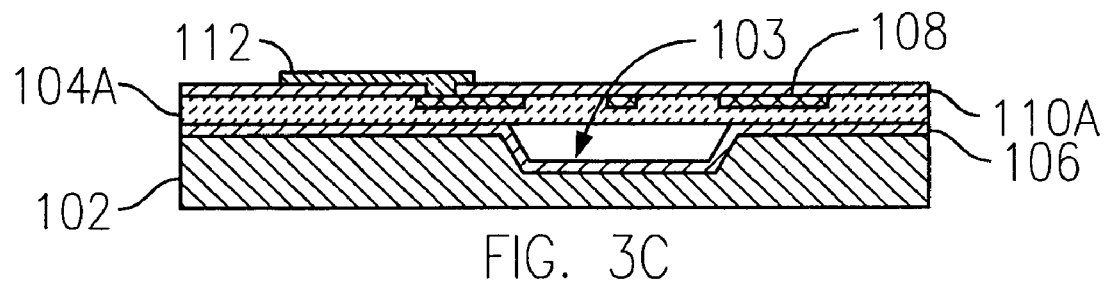
Figure 3D:
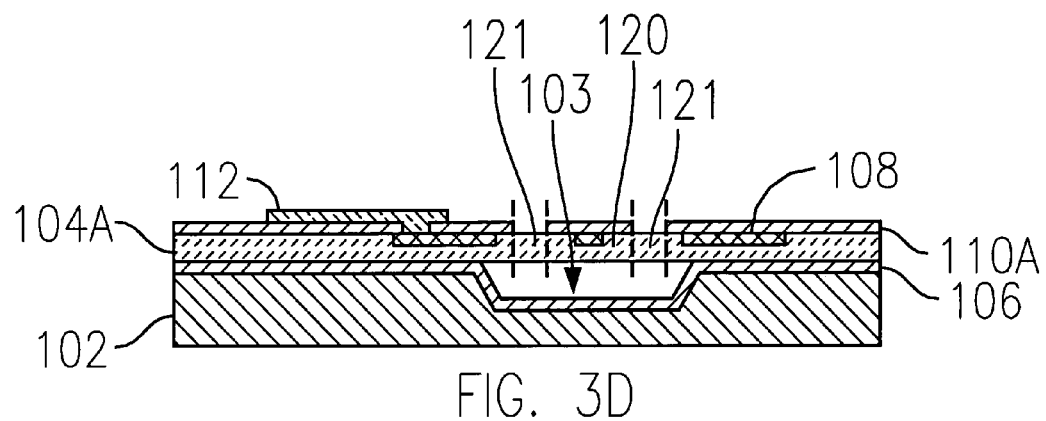
Figure 3E:
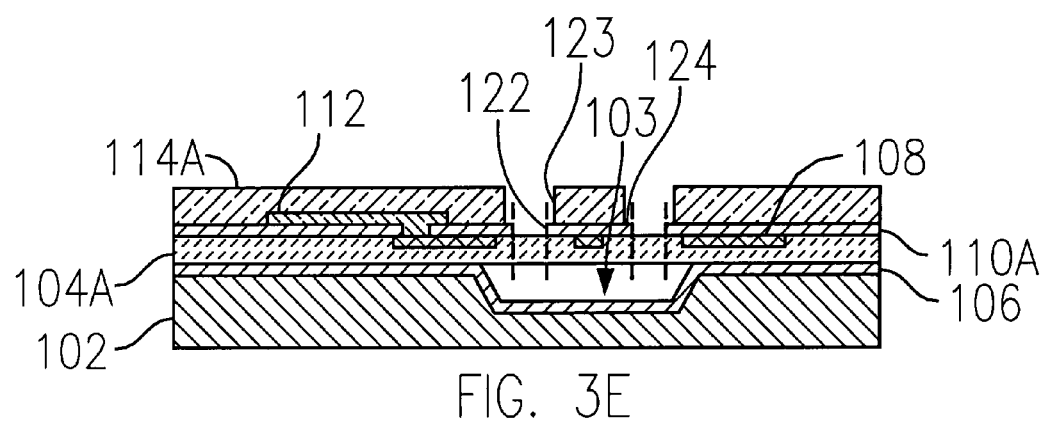
Figure 3F:
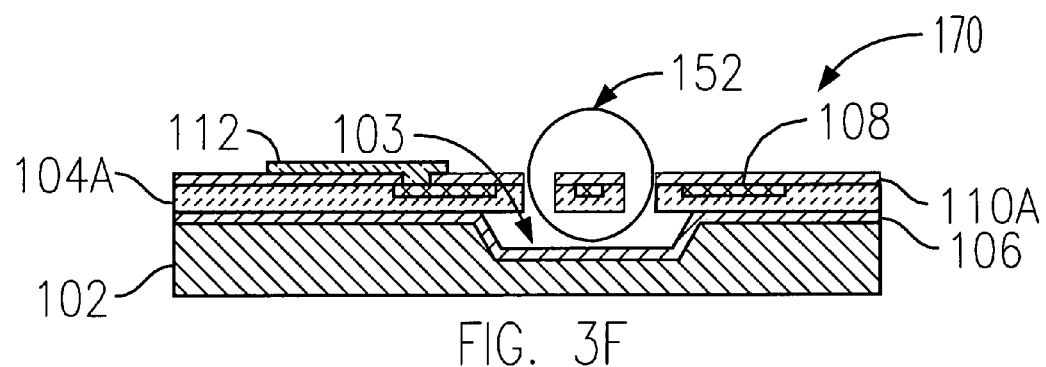

According to the present invention, a process for manufacturing a piezoresistive sensing structure (sensor) is disclosed herein that utilizes a number of well known process steps, including a number of novel process steps that reduce a beam width of the sensor. The process may be generally applied to other micro-machined devices that operate by sensing a strain in a beam, such as velocity, angular rate, impact, force, strain and displacement sensors. It should be appreciated that the initial process steps, as shown in FIGS. 3A-3C are essentially the same as those shown in FIGS. 2A-2C. However, the process deviates beginning in FIG. 3D, as a field passivation layer 110A is selectively removed in a desired pattern of the beam geometry. Referring to FIGS. 3D-3E, wafer 104A comprises a beam region 120 and adjacent areas 121. Thus, according to the present invention, the field passivation layer 110A overlies the beam region 120 between adjacent areas, and has an edge 122 at the adjacent areas 121. A first mask 114A has a sidewall 123 which overlies the passivation layer creating a border 124 between the edge of the passivation layer and the sidewall. The patterned passivation layer serves as a mask for a trench etch, i.e., a deep reactive ion etch (DRIE), that is utilized to form beam 152 (FIG. 3F). As such, the exposed portion of the field passivation layer 110A at the beam 152 is required to withstand the DRIE.

It should be appreciated that the techniques described herein for minimizing a beam width of a sensing structure have broad applicability to sensing structures made through a variety of processes. For example, instead of using a bond/etchback process, the techniques may be employed on a silicon-on insulator (SOI) wafer that is modified through an SOI/deep trench process. In this case, a primary difference between the processes is that the starting material would not initially have a buried cavity. That is, after forming the beam(s), the structure would be released by undercutting the insulating layer of the SOI wafer. Another alternative process would be to utilized a deep trench/undercut process to form the sensing structure. In this case, the starting material would be a plain wafer, e.g., a silicon wafer, and after a deep trench etch, the structure would be undercut using a lateral isotropic silicon etch. In any case, the techniques of the present invention may be used to minimize the beam width of a piezoresistive sensor.

The passivation layer 110A may include, for example, a layer of thermal oxide, which is both a good field passivation and an effective mask for the DRIE. It should be appreciated that other films, common to integrated circuit (IC) processing, may also be utilized. As is shown in FIG. 3E, a photoresist layer 114A is applied and patterned to mask areas of the sensor away from the beam 152. Oversized windows are removed in the photoresist layer 114A in the beam 152 area to expose the field passivation layer 110A. The DRIE is then utilized in the process to remove the unmasked silicon from the wafer 104A, in the exposed areas defining the support beams and the inertial mass.

By utilizing the field passivation layer 110A as the mask in the beam and inertial mass areas, the requirement for the level-to-level alignment is eliminated. Thus, the space 'B' between the edge of the implant and the edge of the passivation layer (required to ensure junction isolation) and the width 'A' of the resistive implant are the limiting features of the design of sensor 170. This allows the sensor 170 to be reduced in overall size and cost. Furthermore, the sensor 170 can be manufactured using a number of existing process steps, without modification.

Figures 2G, 3G:
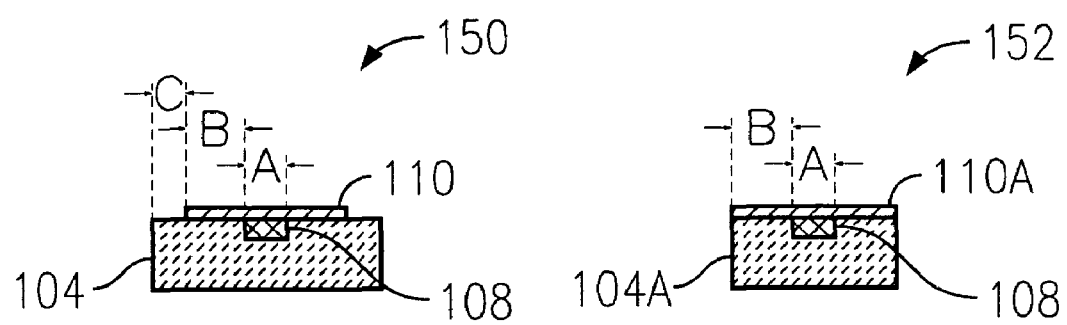
FIGS. 3A-3G depict cross-sectional views of relevant portions of a sensor constructed according to the present invention, during relevant stages of manufacture.

The new sensor design is capable of providing a sensor having a twenty percent reduction in beam width. For example, prior art accelerometers (see FIG. 2G) have had a beam width of approximately nineteen microns (i.e., A=3 microns, B=6 microns and C=2 microns). Whereas, sensors constructed according to the present invention (see FIG. 3G), can achieve a beam width of approximately fifteen microns (i.e., A=3 microns and B=6 microns). The new sensor design differs from the prior art sensor design in that the field passivation is used as a mask for a DRIE, which eliminates the need for level-to-level alignment, allowing for a reduction in width of the sensing beam(s).

Figure 4:
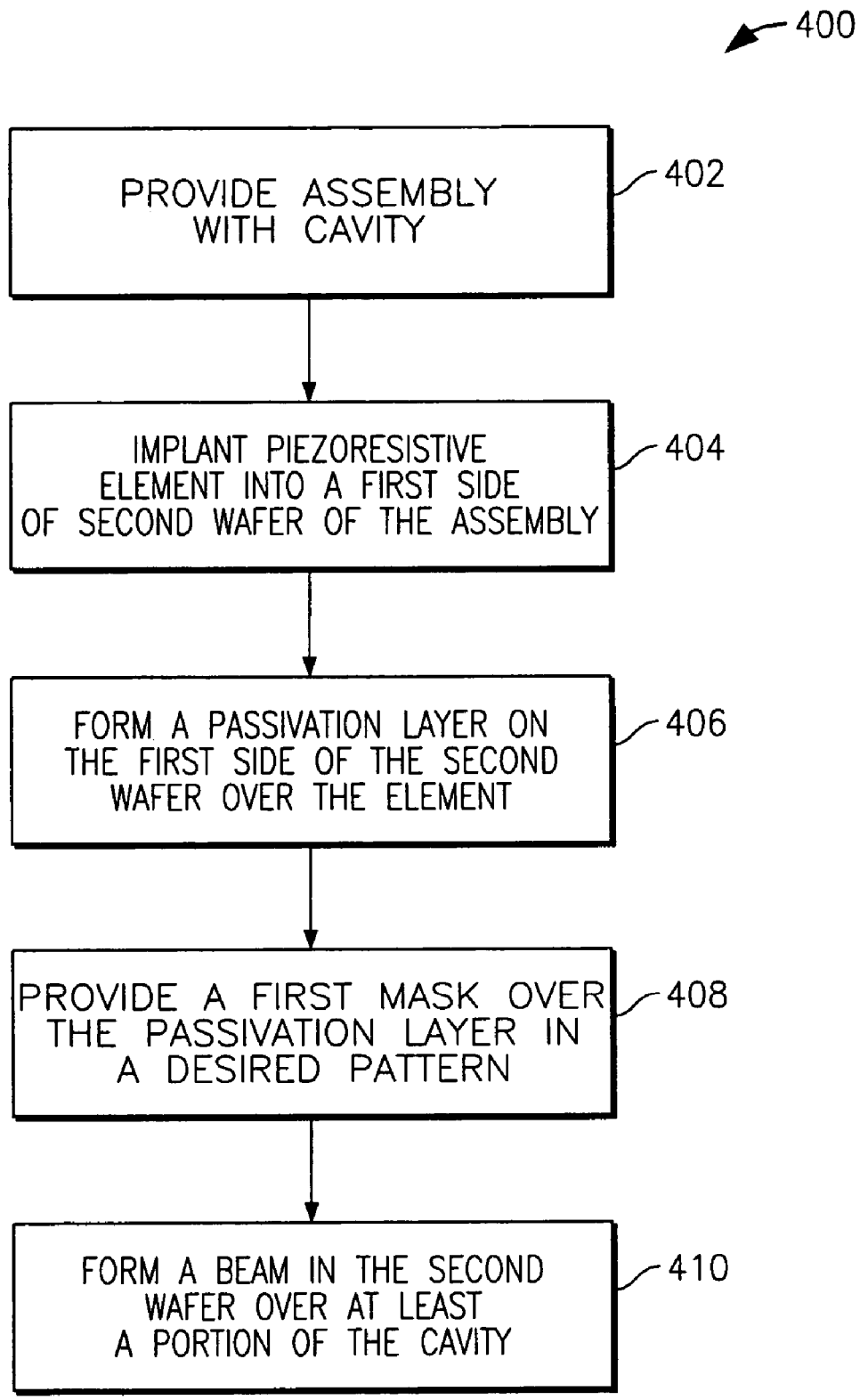
FIG. 4 depicts a flow chart for an exemplary process for manufacturing a sensor according to one aspect of the present invention.

With reference to FIG. 4, an exemplary process 400 for producing the sensor 170 is depicted. Initially, in step 402, an assembly is provided that includes a first wafer 102, having a cavity 103 formed into a first side of the first wafer 102, which is bonded to a second side of a second wafer 104A with an insulator layer 106. A piezoresistive layer 108, including at least one piezoresistive element, is then implanted, in step 404, into a first side of the second wafer 104A, which is opposite the second side of the second wafer 104A. Next, in step 406, a passivation layer 110A is formed on the first side of the second wafer 104A over the element. Then, in step 408, the passivation layer 110A is removed from selected areas on the first side of the second wafer 104A. A first mask is then provided on the passivation layer in a desired pattern. Finally, in step 410, a beam 152, which includes the element, is then formed in the second wafer 104A over at least a portion of the cavity 103. The passivation layer 110A provides a second mask, in the formation of the beam 152, that determines a width of the formed beam 152.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing a piezoresistive sensing structure comprising a beam, said method comprising the steps of:

implanting a piezoresistive element into a first side of an assembly, wherein the assembly includes a semiconductor material having a beam region corresponding to a desired pattern for the beam and adjacent areas to the beam region;

forming a passivation layer on the first side of the assembly over the element;

removing the passivation layer from the adjacent areas on the first side of the assembly such that said passivation layer overlies the beam region and has an edge at the adjacent areas and a border adjacent to the edge;

providing a first mask on the passivation layer in a desired pattern, said mask having a sidewall overlying the passivation layer such that the border is exposed between the edge of the passivation layer and the sidewall; and etching to remove the adjacent areas of the assembly, and thereby form the beam in the assembly over at least a portion of the assembly that is to provide a cavity, wherein the passivation layer provides a second mask in the formation of the beam that determines a width of the formed beam, and wherein the beam includes the element.

2. The method of claim 1, wherein the assembly includes a first wafer having the cavity formed into a first side of the first wafer and a second wafer having a first side and a second side opposite the first side, wherein the second side of the second wafer is bonded to the first side of the first wafer.

3. The method of claim 2, wherein the second wafer is an N-type epitaxial wafer.

4. The method of claim 3, wherein the element is a P-type piezoresistive element.

5. The method of claim 2, wherein the width of the beam substantially corresponds to a width of the passivation layer that is formed on an area of the first side of the second wafer that is to become the beam.

6. The method of claim 5, wherein the width of the beam is about 15 microns.

7. The method of claim 2, wherein the passivation layer includes a thermal oxide layer and a silicon nitride layer.

8. The method of claim 2, wherein the beam is formed with a deep reactive ion etch (DRIE).

9. A method for manufacturing a piezoresistive sensing structure comprising a beam, said method comprising the steps of:

providing an assembly including a first wafer having a cavity formed into a first side of the first wafer and a second wafer having a first side and a second side opposite the first side, wherein the second side of the second wafer is bonded to the first side of the first wafer;

implanting a plurality of piezoresistive elements into the first side of the second wafer, wherein said first side of second wafer has beam regions corresponding to the desired patterns for the beams and adjacent areas to the beam regions;

forming a passivation layer on the first side of the second wafer;

removing the passivation layer from the adjacent areas on the first side of the second wafer such that said passivation layer overlies the beam regions and has an edge at the adjacent areas and a border adjacent to the edge;

providing a first mask on the passivation layer in a desired pattern said mask having a sidewall overlying the passivation layer such that the border is exposed between the edge of the passivation layer and the sidewall; and eching to remove the adjacent areas of the second wafer, and thereby form the central mass that is coupled to a peripheral frame with a plurality of beams in the second wafer, wherein the passivation layer provides a second mask in the formation of the beams that determines a width of the formed beams, and wherein each of the beams includes one of the elements.

10. The method of claim 9, wherein the second wafer is an epitaxial wafer.

11. The method of claim 10, wherein the epitaxial wafer is an N-type epitaxial wafer.

12. The method of claim 9, wherein the elements are P-type piezoresistive elements.

13. The method of claim 9, wherein the width of the beams substantially corresponds to a width of the passivation layer that is formed on an area of the first side of the second wafer that is to become the beams.

14. The method of claim 9, wherein the passivation layer includes a thermal oxide layer and a silicon nitride layer.

15. The method of claim 9, wherein the central mass and the beams are formed with a deep reactive ion etch (DRIE).

* * * * *